(12) United States Patent
Lee et al.

(10) Patent No.: US 11,587,996 B2
(45) Date of Patent: Feb. 21, 2023

(54) DISPLAY APPARATUS

(71) Applicant: Samsung Display Co., Ltd., Yongin-Si (KR)

(72) Inventors: Eonjoo Lee, Hwaseong-si (KR);
Hyoeng-Ki Kim, Suwon-si (KR);
Kwangwoo Park, Hwaseong-si (KR);
Dongki Lee, Seongnam-si (KR);
Jin-Whan Jung, Chungcheongnam-do (KR)

(73) Assignee: Samsung Display Co., Ltd.

( * ) Notice: Subject to any disclaimer, the term of this patent is extended or adjusted under 35 U.S.C. 154(b) by 213 days.

(21) Appl. No.: 17/088,489

(22) Filed: Nov. 3, 2020

(65) Prior Publication Data

US 2021/0050397 A1 Feb. 18, 2021

Related U.S. Application Data

(62) Division of application No. 16/671,098, filed on Oct. 31, 2019, now Pat. No. 10,861,914.

(30) Foreign Application Priority Data

Nov. 6, 2018 (KR) .......................... 10-2018-0135070

(51) Int. Cl.
*H01L 27/32* (2006.01)
*H01L 51/00* (2006.01)
*H01L 51/52* (2006.01)

(52) U.S. Cl.
CPC ...... *H01L 27/3248* (2013.01); *H01L 27/3246* (2013.01); *H01L 27/3258* (2013.01);
(Continued)

(58) Field of Classification Search
None
See application file for complete search history.

(56) References Cited

U.S. PATENT DOCUMENTS

| 11,257,884 B2* | 2/2022 | Lee ...................... H01L 27/3258 |
| 2008/0048191 A1* | 2/2008 | Son ...................... H01L 27/3248 |
| | | 313/506 |

(Continued)

FOREIGN PATENT DOCUMENTS

| KR | 10-2014-0085956 A | 7/2014 |
| KR | 10-1521461 B1 | 5/2015 |

(Continued)

*Primary Examiner* — Alexander G Ghyka
(74) *Attorney, Agent, or Firm* — Innovation Counsel LLP

(57) ABSTRACT

A display apparatus includes a first transistor, a first pixel electrode, a second transistor, and a second pixel electrode. The first transistor includes a first drain electrode. The first pixel electrode is positioned between an edge of the display apparatus and a center of the display apparatus and includes a first recessed structure. The first recessed structure directly contacts the first drain electrode. The second transistor includes a second drain electrode. The second pixel electrode is positioned between the edge of the display apparatus and the first pixel electrode and includes at least one recessed structure. The at least one recessed structure includes a second recessed structure. The second recessed structure directly contacts the second drain electrode. A total maximum width of the at least one recessed structure is greater than a maximum width of the first recessed structure.

5 Claims, 12 Drawing Sheets

(52) U.S. Cl.
CPC ...... *H01L 51/0097* (2013.01); *H01L 51/5253* (2013.01); *H01L 2251/5338* (2013.01)

(56) References Cited

U.S. PATENT DOCUMENTS

| | | | | |
|---|---|---|---|---|
| 2014/0131673 A1* | 5/2014 | Kim | .................... | H01L 51/5225 |
| | | | | 438/34 |
| 2014/0182915 A1 | 7/2014 | Han et al. | | |
| 2015/0263308 A1* | 9/2015 | Park | .................... | H01L 51/5237 |
| | | | | 438/34 |
| 2016/0093680 A1* | 3/2016 | Paek | .................... | H01L 51/5228 |
| | | | | 438/34 |
| 2016/0155786 A1* | 6/2016 | Park | .................... | H01L 27/3258 |
| | | | | 438/23 |
| 2017/0287938 A1 | 10/2017 | Lee et al. | | |
| 2018/0331326 A1* | 11/2018 | Woo | .................... | H01L 51/5275 |
| 2019/0067337 A1 | 2/2019 | Gong et al. | | |
| 2019/0181205 A1* | 6/2019 | Kim | .................... | H01L 27/3258 |
| 2020/0136091 A1 | 4/2020 | Kang et al. | | |
| 2020/0227672 A1* | 7/2020 | Liu | ........................ | H01L 51/56 |

FOREIGN PATENT DOCUMENTS

| | | |
|---|---|---|
| KR | 10-2015-0094841 A | 8/2015 |
| KR | 10-2015-0096541 A | 8/2015 |

* cited by examiner

DISPLAY APPARATUS

This application is a divisional application of U.S. patent application Ser. No. 16/671,098 filed Oct. 31, 2019, which claims priority to and the benefit of Korean Patent Application No. 10-2018-0135070, filed on Nov. 6, 2018 in the Korean Intellectual Property Office; the content of the Korean Patent Application in its entirety is incorporated herein by reference.

BACKGROUND

1. Field

The technical field relates to a display apparatus.

2. Description of the Related Art

Modern display apparatuses may include plasma display apparatuses, liquid crystal display apparatuses, and organic light emitting display apparatuses. A modern display device may have advantages of small size, light weight, and low-power-consumption.

A display apparatus may include a display area for displaying an image. Significantly inconsistent reflection in different portions of the display area may negatively affect the perceived quality of the displayed image.

SUMMARY

Embodiments may be related to a display apparatus with optimized reflectance and satisfactory display quality.

One or more embodiments also provide a display apparatus. The display device includes a base substrate comprising a display area which comprises a middle area and an edge area, and a peripheral area surrounding the display area, a plurality of thin film transistors disposed in the middle area and the edge area, an insulation layer disposed on the thin film transistor, a plurality of SD pattern disposed on the insulation layer, and electrically connected to the plurality of thin film transistor, respectively, and a via insulation layer disposed on the insulation layer on which the SD pattern is disposed, and having a plurality of via holes which exposes the plurality of SD pattern, respectively. The edge area is disposed between the peripheral area and the middle area. A dummy pattern is formed around the via hole in the edge area on the via insulation layer.

In an embodiment, the display apparatus may further include a thin film encapsulation layer disposed on the second electrode. The thin film encapsulation layer may include a first inorganic layer, an organic layer on the first inorganic layer, and a second inorganic insulation layer disposed on the organic insulation layer. A first thickness of the organic layer in the middle area may be greater than a second thickness of the organic layer in the edge area.

In an embodiment, the organic layer may be formed by polymerization of a monomer.

In an embodiment, the dummy pattern may be at least one groove formed on the via insulation layer.

In an embodiment, the edge area may include a first edge area adjacent to the middle area and a second edge area adjacent to the peripheral area. The number of the groove of the dummy pattern in the second edge area may be greater than that in the first edge area.

In an embodiment, the edge area may include a first edge area adjacent to the middle area and a second edge area adjacent to the peripheral area. The dummy pattern may have a first depth in the first edge area, and have a second depth in the second edge area which is greater than the first depth.

In an embodiment, the dummy pattern may be a trench surrounding the via hole and formed on the via insulation layer.

In an embodiment, the display apparatus may further include a plurality of first electrodes disposed on the via insulation layer, and electrically connected to the plurality of SD patterns, respectively, a light emitting layer disposed on the first electrode, and a second electrode disposed on the light emitting layer.

In an embodiment, the first electrode in the edge area may be disposed to overlap the dummy pattern, so that irregularities corresponding to the dummy pattern are formed.

In an embodiment, the via hole may have a first width in the middle area, and has a second width greater than the first width in the edge area.

In an embodiment, the dummy patter may be a groove or a trench formed on the via insulation layer.

In an embodiment, in the edge area, a size of the dummy pattern may gradually increase as it is gradually adjacent to the peripheral area.

In an embodiment, a reflectance of the organic layer in the edge area may be greater than that in the middle area.

In an embodiment, a thickness of the display apparatus in the edge area may be smaller than that in the middle area.

According to an embodiment, a display apparatus includes a base substrate comprising a display area which comprises a middle area and an edge area, and a peripheral area surrounding the display area, a plurality of thin film transistors disposed in the middle area and the edge area, an insulation layer disposed on the thin film transistor, a plurality of SD pattern disposed on the insulation layer, and electrically connected to the plurality of thin film transistor, respectively, and a via insulation layer disposed on the insulation layer on which the SD pattern is disposed, and having a plurality of via holes which exposes the plurality of SD pattern, respectively. The edge area is disposed between the peripheral area and the middle area. The via hole in the middle area has a first width, and the via hole in the edge area has a second width greater than the first width.

According to an embodiment, a display apparatus includes a base substrate, a thin film transistor disposed on the base substrate, a via insulation layer disposed on the thin film transistor, having a via hole and having a dummy pattern formed around the via hole, a first electrode disposed on the via insulation layer, and electrically connected to the thin film transistor through the via hole, a light emitting layer disposed on the first electrode, and a second electrode disposed on the light emitting layer.

In an embodiment, the display apparatus may further include a thin film encapsulation layer disposed on the second electrode. The base substrate may include a display area which comprises a middle area and an edge area, and a peripheral area surrounding the display area. The edge area may be disposed between the peripheral area and the middle area. The thin film encapsulation layer may include a first inorganic layer disposed on the second electrode, an organic layer disposed on the first inorganic layer, and a second inorganic layer on the organic layer. A first thickness of the organic layer in the middle area may be greater than a second thickness of the organic layer in the edge area.

In an embodiment, the dummy pattern may be at least one groove or trench formed on the via insulation layer.

In an embodiment, in the display area, a plurality of pixel structures may be arranged in a matrix form, and each pixel structure may include the thin film transistor, the via hole, and the first electrode. In the middle area, a dummy pattern may not be formed around the via hole. In the edge area, the dummy pattern may be formed around the via hole.

According to the embodiments of the present inventive concept, a display apparatus includes a display area in which an image is displayed and a peripheral area. The display area includes an edge area and a middle area. In the middle area, an organic layer of a thin-film encapsulation layer has a first height on the via hole. The organic layer in the edge area has a second height smaller than the first height on the via hole. A dummy pattern may be formed in the edge area or a size (width) and a depth (height) of the via hole in the edge area may be different from that in the middle area to compensate for a reflectance deviation. Accordingly, it is possible to easily control the deviation of the reflectance simply by forming a dummy pattern around the via hole without a special additional process.

An embodiment may be related to a display apparatus. The display apparatus may include a first transistor structure, a first pixel electrode, a second transistor structure, and a second pixel electrode. The first transistor structure may include a first drain electrode. The first pixel electrode may be positioned between an edge of the display apparatus and a center of the display apparatus and may include a first recessed structure. The first recessed structure may directly contact the first drain electrode. The second transistor structure may include a second drain electrode. The second pixel electrode may be positioned between the edge of the display apparatus and the first pixel electrode and may include at least one recessed structure. The at least one recessed structure may include a second recessed structure. The second recessed structure may directly contact a face of the second drain electrode. A first direction may be parallel to the face of the second drain electrode. A total maximum width of the at least one recessed structure in the first direction may be greater than a maximum width of the first recessed structure in the first direction. Referring to FIG. 3A and FIG. 3B, the total maximum width of the recess structures of 181 corresponding to VIA and DM shown in FIG. 3B is greater than the maximum width of the recess structure of 181 corresponding to VIA shown in FIG. 3A. Referring to FIG. 6A and FIG. 6B, the total maximum width of the recess structure of 181 corresponding to VIA shown in FIG. 6B is greater than the maximum width of the recess structure of 181 corresponding to VIA shown in FIG. 6A.

The display apparatus may include an organic layer. A first section of the organic layer may overlap the first pixel electrode. A second section of the organic layer may overlap the second pixel electrode and may be thinner than the first section of the organic layer in a second direction. The second direction may be perpendicular to the first direction.

The organic layer may be formed by polymerization of a monomer.

The at least one recessed structure further may include a third recessed structure. The second recessed structure may be deeper than the third recessed structure in a second direction. The second direction may be perpendicular to the first direction.

The display apparatus may include a third transistor structure and a third pixel electrode. The third transistor structure may include a third drain electrode. The third pixel electrode may be positioned between the edge of the display apparatus and the second pixel electrode, may include a third recessed structure, and may include one or more additional recessed structures. The third recessed structure may directly contact the third drain electrode. A total number of recessed structures of the third pixel electrode may be greater than a total number of recessed structures of the second pixel electrode.

The display apparatus of may include a third transistor structure and a third pixel electrode. The third transistor structure may include a third drain electrode. The third pixel electrode may be positioned between the edge of the display apparatus and the second pixel electrode and may include a third recessed structure. The third recessed structure may directly contact the third drain electrode. The second electrode may further include a fourth recessed structure. The third electrode further may include a fifth recessed structure. The fifth recessed structure may be deeper than the fourth recessed structure in a second direction. The second direction may be perpendicular to the first direction.

The at least one recessed structure may further include a third recessed structure surrounding the second recessed structure.

The at least one recessed structure may further include a third recessed structure. The third recessed structure may overlap the second drain electrode.

The at least one recessed structure may further include a plurality of surrounding recessed structures. The surrounding recessed structures may be spaced from one another and surround the second recessed structure. Each of the surround recessed structures may be smaller than the second recessed structure in a plan view of the display apparatus.

The display apparatus may include a pixel defining layer having an opening that partially exposes the second pixel electrode. The at least one recessed structure may further include a third recessed structure. A portion of the pixel defining layer may be positioned inside the third recessed structure.

A maximum width of the second recessed structure in the first direction may be greater than the maximum width of the first recessed structure in the first direction.

The at least one recessed structure may further include a third recessed structure and a third structure each narrower than the second recessed structure in the first direction. The second recessed structure may be positioned between the third recessed structure and the fourth recessed structure.

The display apparatus may include a third transistor structure and a third pixel electrode. The third transistor structure may include a third drain electrode. The third pixel electrode may be positioned between the edge of the display apparatus and the second pixel electrode and may include a third recessed structure. The third recessed structure may directly contact the third drain electrode. The second electrode may further include a fourth recessed structure. The third electrode may further include a fifth recessed structure. The fifth recessed structure may be wider than the fourth recessed structure in the first direction.

The display apparatus may include an organic layer. A first section of the organic layer may overlap the first pixel electrode. A second section of the organic layer may overlap the second pixel electrode. A reflectance of the second section of the organic layer may be greater than a reflectance of the first section of the organic layer.

A first section of the display apparatus may include the first pixel electrode. A second section of the display apparatus may include the second pixel electrode. A maximum thickness of the second section of the display apparatus may be smaller than a maximum thickness of the first section of the display apparatus.

A total direct contact area between the second recessed structure and the second drain electrode may be wider than a total direct contact area between the first recessed structure and the first drain electrode.

The at least one recessed structure may further include a third recessed structure spaced from the second recessed structure and concentric with the second recessed structure in a plan view of the display apparatus.

The first transistor structure may further include a first semiconductor member connected to the first drain electrode. The second transistor structure may further include a second semiconductor member connected to the second drain electrode. A total overlap between the second recessed structure and the second semiconductor member may be wider than a total overlap between the first recessed structure and the first semiconductor member.

The at least one recessed structure may further include a third recessed structure. The second transistor structure may further include a semiconductor member connected to the second drain electrode. Both the second recessed structure and the third recessed structure may overlap the semiconductor member.

The display apparatus may include a light emission layer overlapping the second pixel electrode. The at least one recessed structure may further include a third recessed structure spaced from the second recessed structure. At least a portion of the third recessed structure may be positioned between the second recessed structure and the light emission layer.

DETAILED DESCRIPTION

Example embodiments are explained with reference to the accompanying drawings.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

The term "dummy pattern" may mean "recessed structure" or "hole." The term "SD pattern" may mean "drain electrode." The term "thin film transistor" may mean "semiconductor member." The term "first electrode" may mean "pixel electrode." The term "second electrode" may mean "overlapping electrode," "opposite electrode," or "common electrode."

Figure 1:
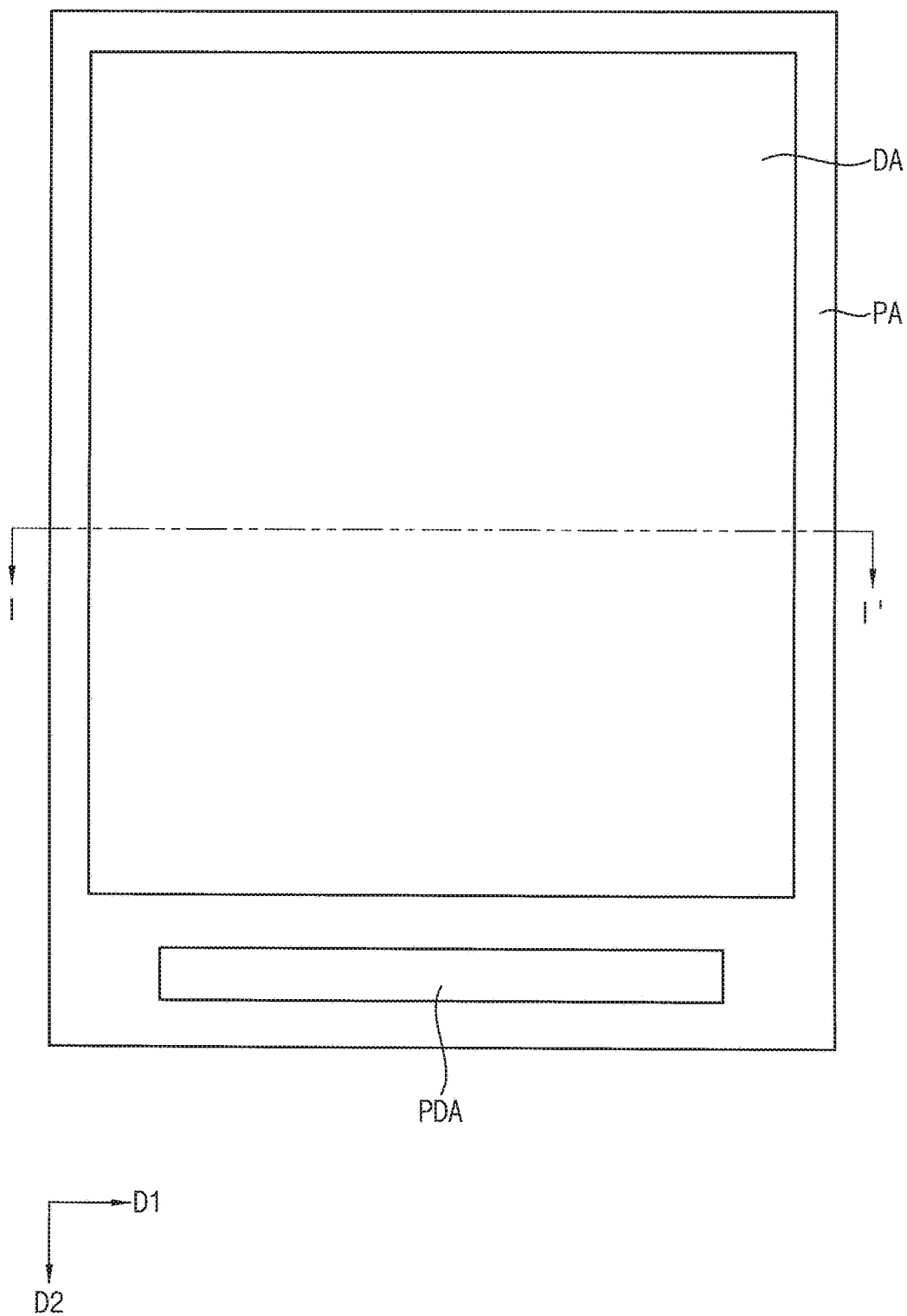
FIG. 1 is a plan view illustrating a display apparatus according to an embodiment.
Figure 2:
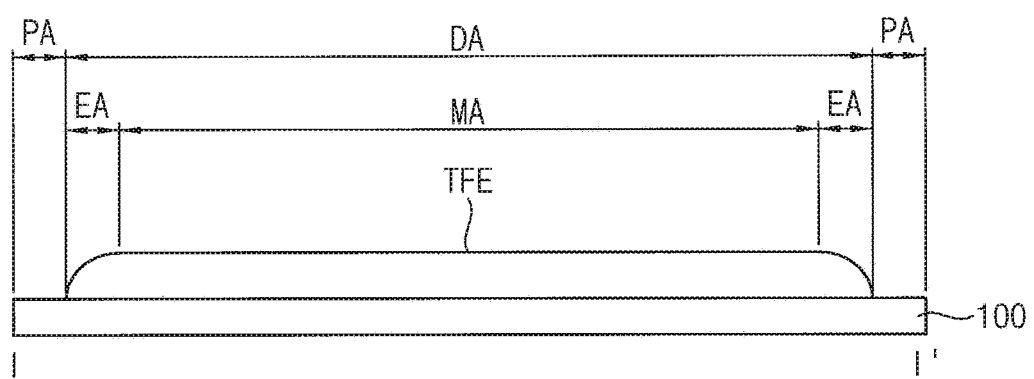
FIG. 2 is a cross-sectional view taken along a line I-I' of FIG. 1 according to an embodiment.
Figure 3A:
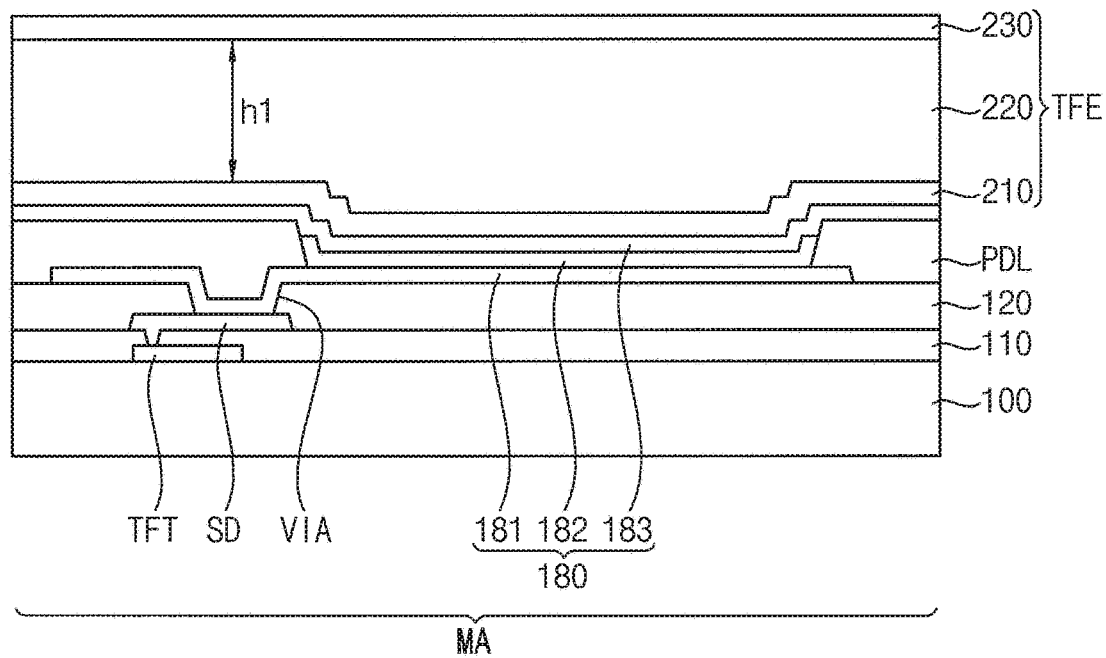
FIG. 3A is a cross-sectional view of a pixel in a middle area MA of the display apparatus of FIG. 2 according to an embodiment.
Figure 3B:
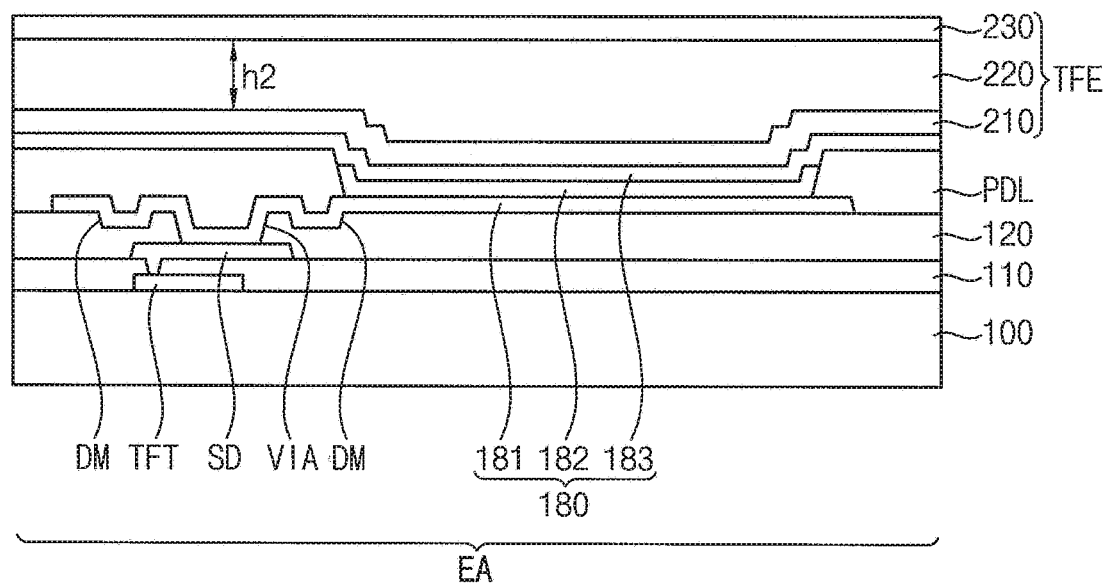
FIG. 3B is a cross-sectional view of a pixel in an edge area EA of the display apparatus of FIG. 2 according to an embodiment.

FIG. 1 is a plan view illustrating a display apparatus according to an embodiment. FIG. 2 is a cross-sectional view taken along a line I-I' of FIG. 1 according to an embodiment. FIG. 3A is a cross-sectional view of a pixel in a middle area MA of the display apparatus of FIG. 2 according to an embodiment. FIG. 3B is a cross-sectional view of a pixel in an edge area EA of the display apparatus of FIG. 2 according to an embodiment.

Referring to FIGS. 1 and 2, the display apparatus may include a display area DA for displaying an image and a peripheral area PA adjacent to the display area DA. The peripheral area PA may be a non-display area and may surround the display area DA.

The display area DA may have a rectangular shape, with edges extending in a first direction D1 and a second direction D2 perpendicular to the first direction D1. The display apparatus may include pixels arranged in a matrix form for displaying an image. The pixels may include thin film transistors and may be disposed in the display area DA. The display apparatus may include data lines (not shown) electrically connected to the pixels. The display apparatus may include scan lines (not shown) electrically connected to the pixels and crossing the data lines. The display area DA may include a middle area MA and may include an edge area EA near an edge of the display area DA. The edge area EA may be disposed between the middle area MA and the peripheral area PA and disposed between the middle area MA and an edge of the display apparatus.

The peripheral area PA is a non-display area, adjacent to the display area DA, and may surround the display area DA. A circuit structure for driving the pixel structures of the display area DA may be formed in the peripheral area PA. A driving circuit chip (not shown) may be mounted on one side of the peripheral area PA. The peripheral area PA may include a pad part PDA to be connected to an external driving substrate.

Referring again to FIG. 2, the display apparatus may include a base substrate 100, a thin film encapsulation layer TFE, and a structure formed between the substrate 100 and the thin film encapsulation layer TFE.

The thin film encapsulation layer TFE may include at least one organic layer (see 220 in FIG. 3A). The organic layer may be formed by polymerization of a monomer. Due to a reflow phenomenon of the monomer during a formation of the organic layer, a thickness difference occurs in the middle area MA and the edge area EA of the display area DA of the display apparatus. For example, the thickness difference between the middle area MA and the edge area EA of the organic layer may be about 4 μm (micrometers). For a conventional display apparatus, the thickness difference may lead to a difference in optical characteristics occurs in the middle area MA and the edge area EA, causing degradation of display quality.

According to an embodiment, in order to prevent display quality deterioration due to the difference in optical characteristics between the middle area MA and the edge area EA, a dummy pattern (see DM in FIG. 3B) may be implemented.

FIG. 3A is a cross-sectional view of a pixel in a middle area MA of the display apparatus of FIG. 2 according to an embodiment. The display apparatus may include a base substrate 100, a thin film transistor TFT, an insulating layer 110, an SD pattern SD, a via insulation layer 120, a light emitting structure 180, a pixel defining layer PDL and a thin-film encapsulation layer TFE in the middle area MA.

The base substrate 100 may include one or more transparent or opaque insulation materials. For example, the base substrate 100 may include at least one of a quartz substrate, a synthetic quartz substrate, a calcium fluoride substrate, a fluoride-doped quartz substrate, a sodalime glass substrate, a non-alkali glass substrate etc. The base substrate 100 may include a flexible transparent material such as a flexible transparent resin (e.g., a polyimide). The substrate 100 may include a first polyimide layer, a barrier film layer, a second polyimide layer, etc. The substrate 100 may have a configuration where the first polyimide layer, the barrier film layer, and the second polyimide layer, are stack.

The thin film transistor TFT may be disposed on the base substrate 100. The thin film transistor TFT may include at least one of an amorphous silicon semiconductor, a crystalline silicon semiconductor, an oxide semiconductor, and the like.

The insulation layer 110 may be disposed on the base substrate 100 and on the thin film transistor TFT. The insulation layer 110 may include a plurality of insulation layers for insulating the thin film transistor TFT from other components. For example, the insulation layer 110 may include a gate insulation layer, an interlayer insulation layer, and the like. The insulation layer 110 may include an inorganic insulation material such as a silicon compound, a metal oxide, or the like.

The SD pattern SD may be disposed on the insulation layer 110. The SD pattern SD may be electrically connected to the thin film transistor TFT through a contact hole formed through the insulation layer 110. The SD pattern SD may be formed using a metal, an alloy, a metal nitride, a conductive metal oxide, a transparent conductive material, or the like. The SD pattern SD may include a plurality of layers.

The via insulation layer 120 may be disposed on the insulation layer 110 and on the SD pattern SD. A via hole VIA that exposes the SD pattern SD may be formed through the via insulation layer 120. The via insulation layer 120 may be formed in a single layer structure, but may be formed in a multi-layer structure including at least two insulation layers. The via insulation layer 120 may be formed using an organic material such as a photoresist, an acrylic resin, a polyimide resin, a polyamide resin, or a siloxane-based resin.

The light emitting structure 180 may include a first electrode 181, an emission layer 182 and a second electrode 183.

The first electrode 181 may be disposed on the via insulation layer 120. The first electrode 181 may include a reflective material or a transmissive material in accordance with the emission type of the display apparatus. The first electrode 181 may have a single layer structure or a multi-layer structure, which may include a metal film, an alloy film, a metal nitride film, a conductive metal oxide film and/or a transparent conductive film.

The pixel defining layer PDL may be disposed on the via insulation layer 120 on which the first electrode 181 is disposed. The pixel defining layer PDL may be formed using an organic material. For example, the pixel defining layer PDL may include at least one of photoresist, acryl-based resin, polyimide-based resin, polyamide-based resin, siloxane-based resin, etc. In some example embodiments, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer 182 may be disposed on a portion of the first electrode 181 exposed through the opening of the pixel defining layer PDL. The light emitting layer 182 may extend on a sidewall of the opening of the pixel defining layer PDL. The light emitting layer 182 may include an organic light emitting layer (EL), a hole injection layer (HIL), a hole transfer layer (HTL), an electron transfer layer (ETL), an electron injection layer (EIL), etc. In some example embodiments, a plurality of organic light emitting layers may be formed using light emitting materials for generating different colors of light such as a red color of light, a green color of light and a blue color of light in accordance with color pixels of the display device. The organic light emitting layer of the of the light emitting layer 182 may include a plurality of stacked light emitting materials for generating red light, green light and blue light to thereby emit white light.

The second electrode 183 may be disposed on the pixel defining layer PDL and the light emitting layer 182. The second electrode 183 may include a transmissive material or a reflective material in accordance with the emission type of the display device. The second electrode 183 may have a single layer structure or a multi-layer structure, which may include a metal film, an alloy film, a metal nitride film, a conductive metal oxide film and/or a transparent conductive film.

The thin film encapsulation layer TFE may be disposed on the second electrode 183. The thin film encapsulation layer TFE may prevent penetration of moisture and oxygen from outside. The thin film encapsulation layer TFE may include at least one organic layer and at least one inorganic layer. Organic layers and inorganic layers may be alternately stacked. Thus, the thin film encapsulation layer TFE may include a first inorganic layer 210 disposed on the second electrode 183, an organic layer 220 disposed on the first inorganic layer 210, and a second inorganic layer 230 disposed on the organic layer 220.

The organic layer 220 may have a first height h1 on the via hole VIA. The organic layer 220 may be formed by polymerization of at least one monomer selected from a group consisting of pentabromophenyl acrylate, 2-(9H-Carbazol-9-yl) ethyl methacrylate, N-vinylcarbazole, Bis (methacryloylthiophenyl) sulfide, and zirconium acrylate.

The inorganic layers 210 and 230 may include at least one inorganic material selected from AlxOy, TiOx, ZrOx, SiOx, AlOxNy, AlxNy, SiOxNy, SixNy, ZnOx, and TaxOy.

Figure 4:
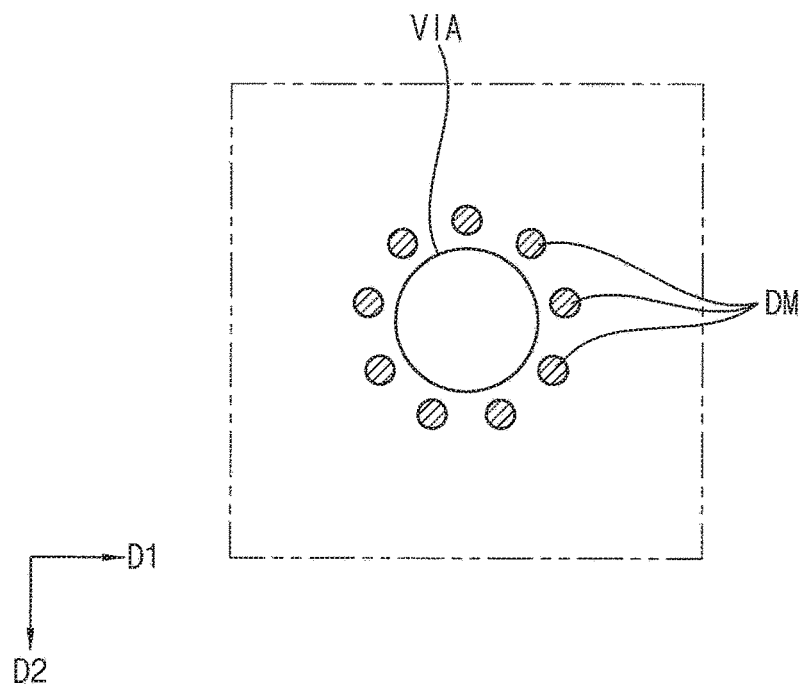
FIG. 4 is a plan view showing a via hole VIA and a dummy pattern DM around the via hole VIA of the display apparatus of FIG. 3B according to an embodiment.

FIG. 3B is a cross-sectional view of a pixel in an edge area EA of the display apparatus of FIG. 2 according to an embodiment. FIG. 4 is a plan view showing a via hole VIA and a dummy pattern DM around the via hole VIA of the display apparatus of FIG. 3B according to an embodiment.

Referring to FIGS. 3B and 4, the display apparatus may include a base substrate 100, a thin film transistor TFT, an insulating layer 110, an SD pattern SD, a via insulation layer 120, a light emitting structure 180, a pixel defining layer PDL and a thin-film encapsulation layer TFE in the edge area EA. The light emitting structure 180 may include a first electrode 181, an emission layer 182 and a second electrode 183. The thin film encapsulation layer TFE may include a first inorganic layer 210, an organic layer 220, and a second inorganic layer 230.

A pixel structure in the edge area EA is substantially same as that in the middle area MA, except for a dummy pattern DM of a via insulating layer 120, and a height of an organic layer 220 of a thin film encapsulation layer TFE. Therefore, some explanation may not be repeated.

In the edge area EA, the organic layer 220 of the thin film encapsulation layer TFE may have a second height h2 on the via hole VIA. The second height (h2) is smaller than the first height h1. As described above, the organic layer 220 can be formed by polymerization of a monomer. A height (thickness) difference between in the middle area (see MA in FIG. 3A) and the edge area EA may be caused by the reflow phenomenon of the monomer during the formation of the organic layer 220.

Due to the difference in height, a significant difference in reflectance may occur in the middle area and the edge area EA of the display apparatus if the dummy pattern DM is not implemented. As the thickness of the organic layer 220 decreases, the transmittance may become lower, and the amount of absorbed light may become greater. Without compensation, the reflectance of the middle area (where the organic layer 220 is relatively thick) may be significantly lower than that of edge area EA (where the organic layer 220 is relatively thin). Table 1 shows reflectance values for various samples.

TABLE 1

| Sample | reflectance | |
|---|---|---|
| | SCI | SCE |
| Sample 1 MN(4) | 4.64 | 0.25 |
| Sample 1 MN(8) | 4.61 | 0.24 |
| Sample 2 MN(4) | 4.75 | 0.34 |
| Sample 2 MN(8) | 4.67 | 0.28 |
| Sample 3 MN(4) | 4.72 | 0.26 |
| Sample 3 MN(8) | 4.69 | 0.25 |
| Sample 4 MN(4) | 4.78 | 0.33 |
| Sample 4 MN(8) | 4.73 | 0.29 |

TABLE 1-continued

| Sample | reflectance | |
|---|---|---|
| | SCI | SCE |

In Table 1, MN(8) means height of organic layer is 8 μm, MN(4) means height of organic layer is 4 μm, SCI means reflectance including regular reflection, and SCE means reflectance excluding regular reflection.

Figure 10A:
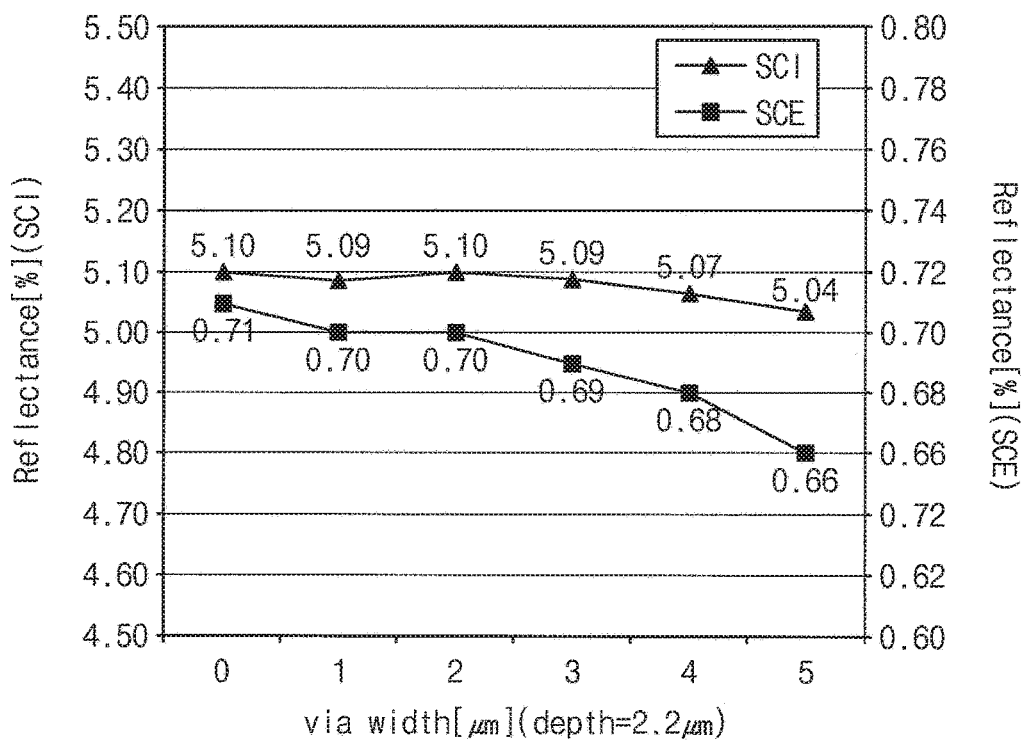
FIG. 10A and FIG. 10B are graphs showing that reflectance decreases as size or depth of via hole increases.
Figure 10B:
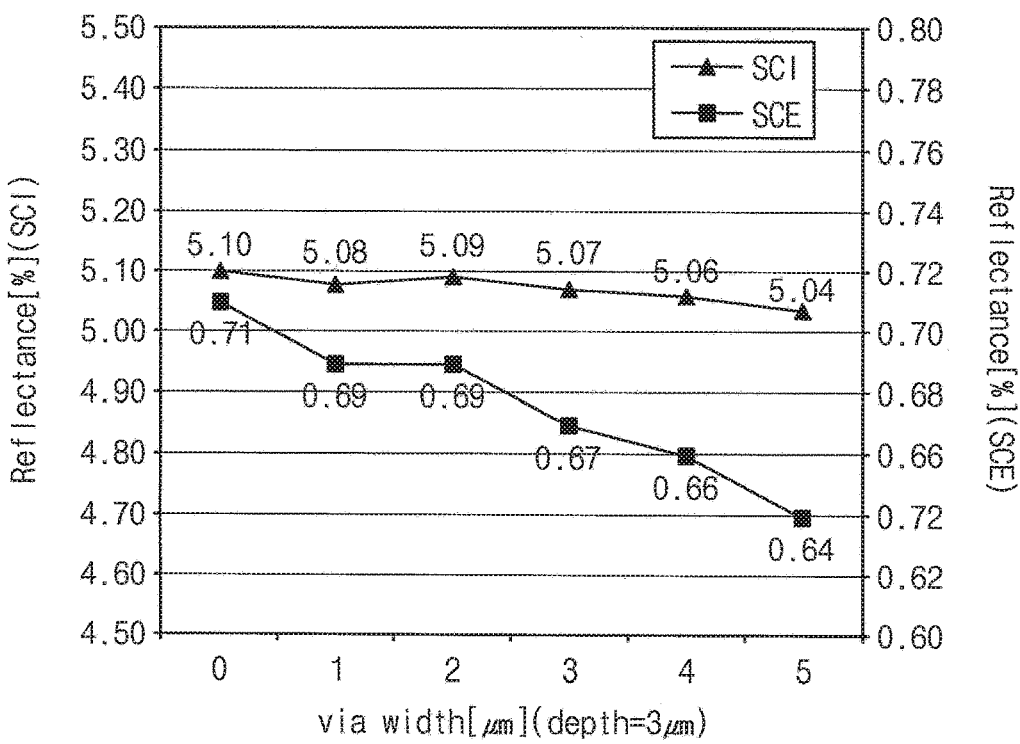

In order to compensate for the reflectance difference, sizes (widths) and/or depths (heights) of via holes VIA can be configured differently. As shown in FIGS. 10A and 10B, reflectance decreases as the size or depth of the via hole VIA increases. In an embodiment, reflectance difference may be compensated according to the thickness variation of the organic layer 220.

On the via insulation layer 120, the dummy pattern DM may be formed around the via hole VIA. The dummy pattern DM may be a plurality of grooves formed around the via hole VIA on a top surface of the via insulation layer 120. By the dummy pattern DM, an effect similar to that of the total width of the via increases can be obtained. Specifically, the first electrode 181 on the via insulation layer 120 includes one or more recessed structures according to the dummy pattern DM, and the one or more recessed structures cause irregular reflection and/or canceled reflection, so that the reflectance in the edge area EA, where the dummy pattern DM is formed, can be lowered. Accordingly, it is possible to compensate for the difference in reflectance between the edge area EA and the middle area.

In the edge area EA, the first electrode 181 may overlap with the dummy pattern DM, so that irregularities and/or recessed structures corresponding to the dummy pattern DM may be formed. The pixel defining layer PDL may be disposed on the dummy pattern DM.

Figure 5:
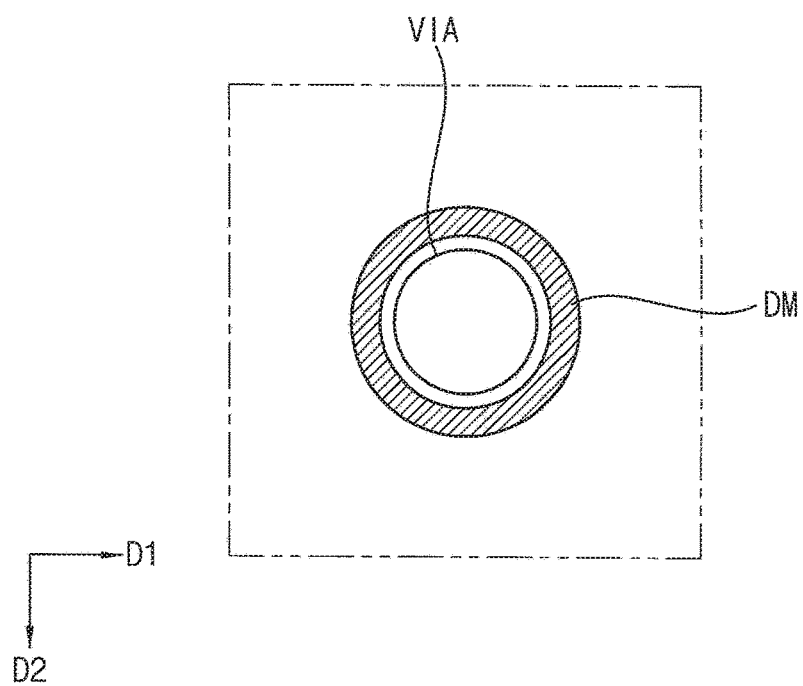
FIG. 5 is a plan view showing a via hole VIA and a dummy pattern DM around the via hole VIA of a display apparatus according to an embodiment.

FIG. 5 is a plan view showing a via hole VIA and a dummy pattern DM around the via hole VIA of a display apparatus according to an embodiment.

Referring to FIG. 5, the display apparatus is substantially the same as the display apparatus of FIGS. 1 to 4 except for a structure of a dummy pattern DM. Therefore, some explanation may not be repeated.

The dummy pattern DM may be an annular trench surrounding the via hole VIA. The shape(s) of the dummy pattern DM can be configured according to embodiments.

Figure 6A:
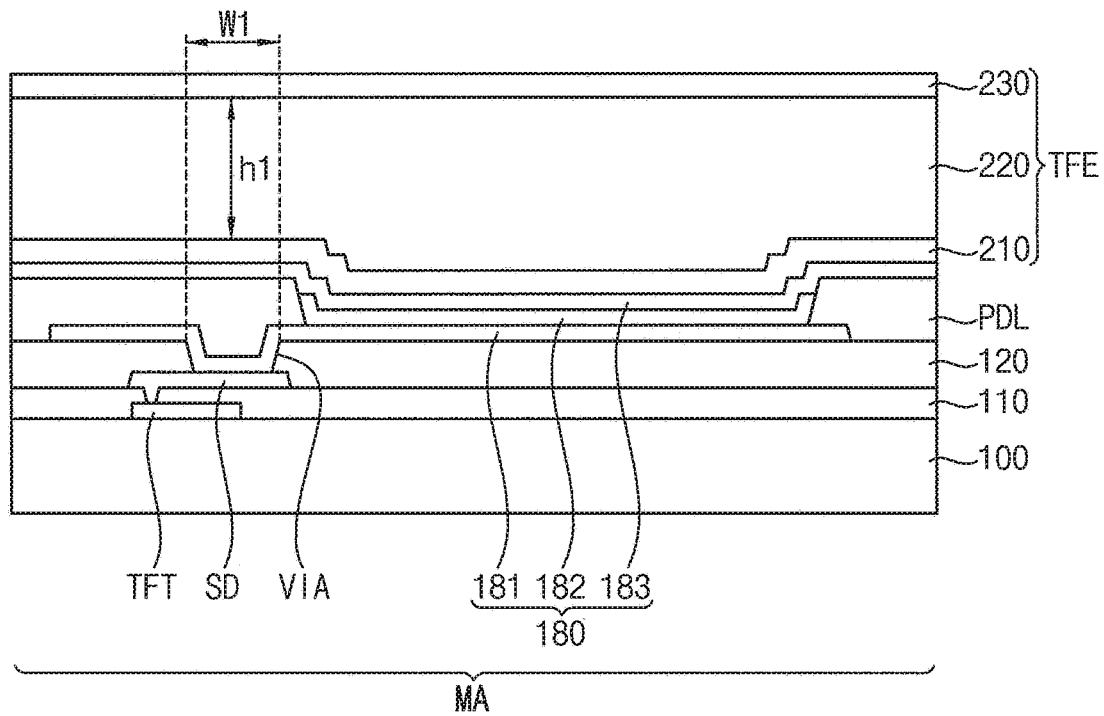
FIG. 6A is a cross-sectional view of a pixel in a middle area MA according to an embodiment.
Figure 6B:
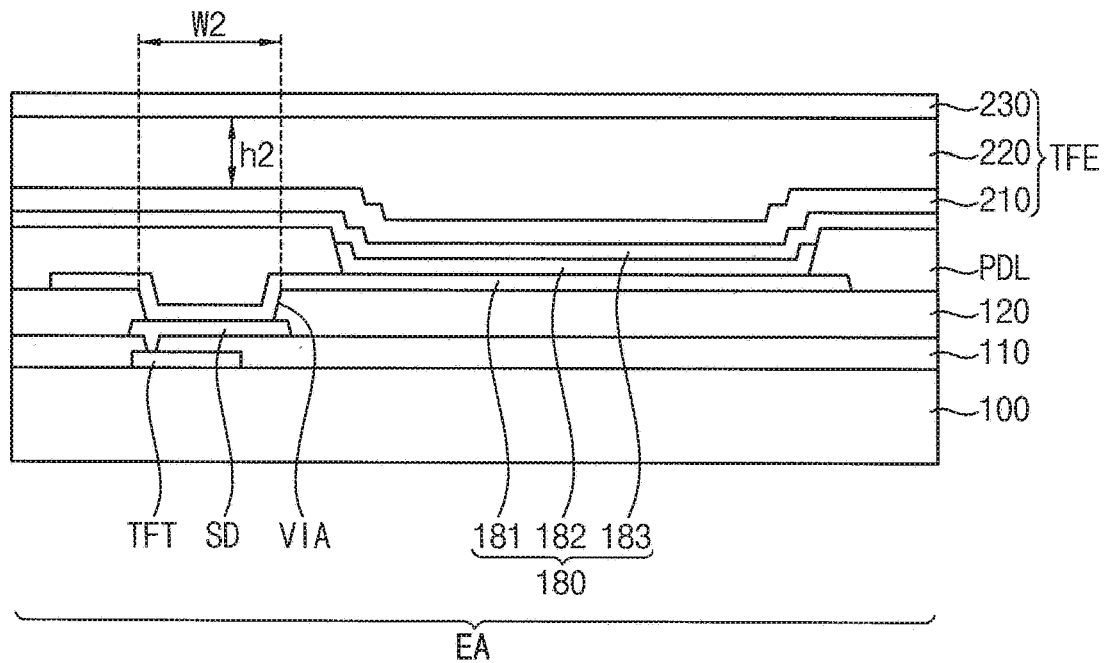
FIG. 6B is a cross-sectional view of a pixel in an edge area EA of the display apparatus of FIG. 6A according to an embodiment.

FIG. 6A is a cross-sectional view of a pixel in a middle area MA according to an embodiment. FIG. 6B is a cross-sectional view of a pixel in an edge area EA of the display apparatus of FIG. 6A according to an embodiment.

Referring to FIGS. 6A to 6B, the display apparatus may include a base substrate 100, a thin film transistor TFT, an insulating layer 110, an SD pattern SD, a via insulation layer 120, a light emitting structure 180, a pixel defining layer PDL and a thin-film encapsulation layer TFE in the middle area MA and the edge area EA. The light emitting structure 180 may include a first electrode 181, an emission layer 182 and a second electrode 183. The thin film encapsulation layer TFE may include a first inorganic layer 210, an organic layer 220, and a second inorganic layer 230.

In the middle area MA, the via hole VIA may have a first width w1 and the organic layer 220 may have a first height h1. In the edge area EA, the via hole VIA may have a second width w2 greater than the first width w1 and the organic layer 220 may have a second height h2 less than the first height h1. Since the second width w2 is greater than the first width w1, the reflectance difference between the edge area EA and the middle area can be compensated.

Figure 7:
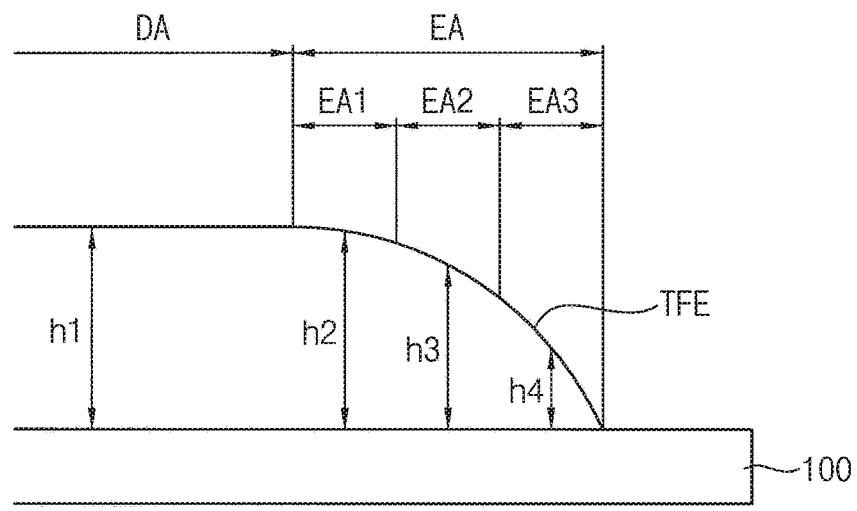
FIG. 7 is a cross-sectional view of a portion of a display apparatus according to an embodiment.

FIG. 7 is a cross-sectional view of a portion of a display apparatus according to an embodiment. FIGS. 8A to 8D are plan views showing a via hole VIA in a display area DA and showing a via hole VIA and a dummy pattern DM around the via hole VIA in each of a first edge area EA1, a second edge area EA2, and a third edge area EA3 of the display apparatus of FIG. 7 according to an embodiment.

Figure 8A:
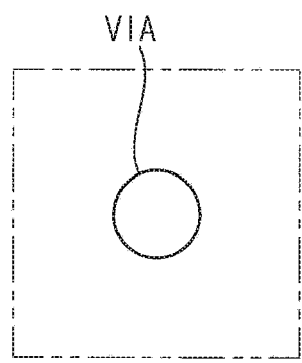
FIGS. 8A to 8D are plan views showing a via hole VIA in the a display area and showing a via hole VIA and a dummy pattern DM around the via hole VIA in each of a first edge area EA1, a second edge area EA2, and a third edge area EA3 of the display apparatus of FIG. 7 according to an embodiment.
Figure 8B:
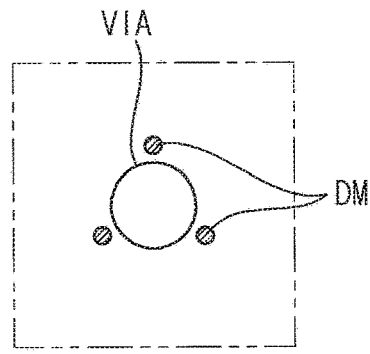
Figure 8C:
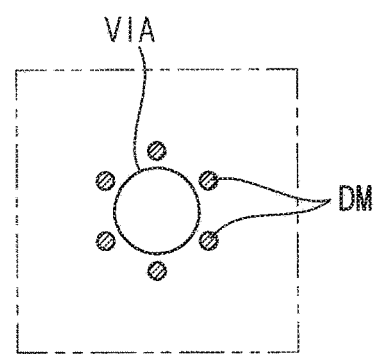
Figure 8D:
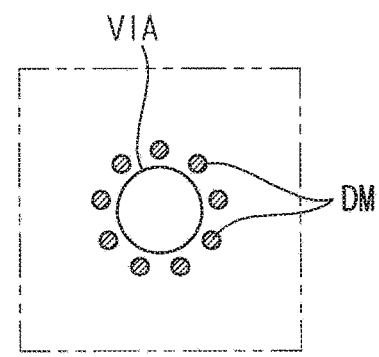
Figure 9A:
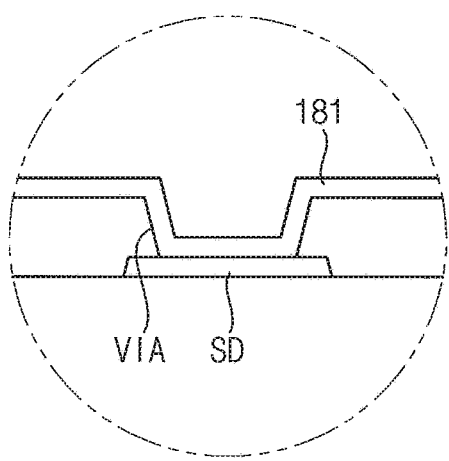
FIGS. 9A to 9D are cross-sectional views showing a via hole VIA in the a display area and showing a via hole VIA and a the dummy pattern DM around the via hole VIA in each of a first edge area EA1, a second edge area EA2, and a third edge area EA3 of a display apparatus according to an embodiment.
Figure 9B:
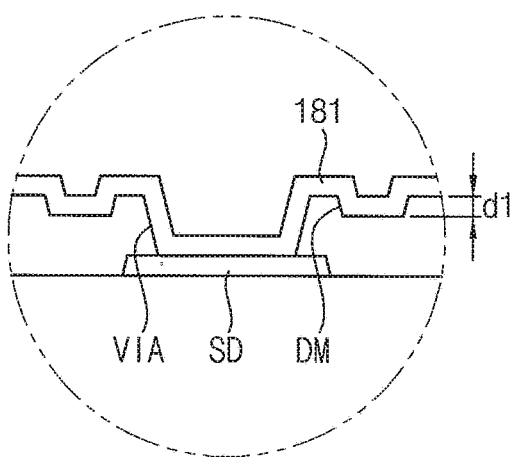
Figure 9C:
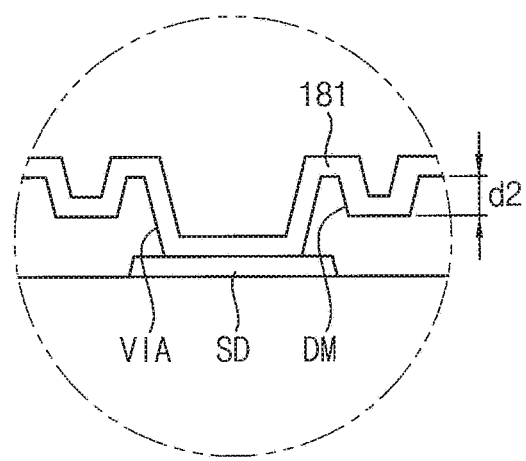
Figure 9D:
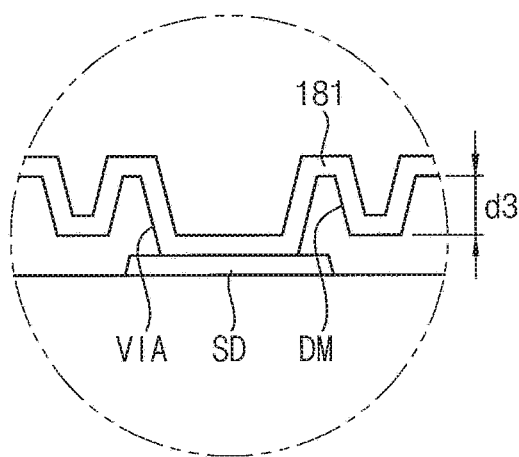

Referring to FIGS. 7 to 8D, the display apparatus may include an edge area EA including a first edge area EA1, a second edge area EA2 and a third edge area EA3. The first to third edge areas EA1, EA2 and EA3 may be sequentially arranged in the display area DA to a peripheral area PA.

The display apparatus may have features analogous to or substantially same as features described with reference to one or more of FIGS. 1 to 6 except that the sizes or the numbers of the dummy patterns DM in the first to third edge areas EA1, EA2, and EA3 are different from each other. Therefore, some explanation may not be repeated.

In the display area, no dummy patterns may be formed around the via hole VIA. The organic layer of the thin film encapsulation layer TFE in the display area DA may have a first height h1. (a)

In the first edge area EA1, a dummy pattern DM including three grooves may be formed around the via hole VIA. The organic layer of the thin film encapsulation layer TFE in the first edge area EA1 may have a second height h2 that is less than the first height h1. (b)

In the second edge area EA2, a dummy pattern DM including six grooves may be formed around the via hole VIA. The organic layer of the thin film encapsulation layer TFE in the second edge area EA2 may have a third height h3 that is less than the second height h2. (c)

In the third edge area EA3, a dummy pattern DM including nine grooves may be formed around the via hole VIA. The organic layer of the thin film encapsulation layer TFE in the third edge area EA3 may have a fourth height h4 that is less than the third height h3. (d)

According to an embodiment, as the thickness of the organic layer of the thin film encapsulation layer TFT in the edge area EA becomes smaller, the size or number of the dummy pattern DM becomes larger, so that reflectance difference according to the thickness of the organic layer can be compensated.

FIGS. 9A to 9D are cross-sectional views showing a via hole VIA in a display area and showing a via hole VIA and a dummy pattern DM around the via hole VIA in each of a first edge area EA1, a second edge area EA2, and a third edge area EA3 of a display apparatus according to an embodiment.

Referring to FIGS. 9A to 9D, the display apparatus may have features analogous to or substantially the same as features described with reference to one or more of FIGS. 1 to 8 except that depths of the dummy patterns DM in the first to third edge areas EA1, EA2, and EA3 are different from each other. Therefore, some explanation may not be repeated.

In the display area, no dummy patterns may be formed around the via hole VIA. (a)

In the first edge area EA1, a dummy pattern DM having a first depth d1 may be formed around the via hole VIA. (b)

In the second edge area EA2, a dummy pattern DM having a second depth d2 larger than the first depth d1 may be formed around the via hole VIA. (c)

In the third edge area EA3, a dummy pattern DM having a third depth d3 larger than the second depth d2 may be formed around the via hole VIA. (d)

According to an embodiment, as the thickness of the organic layer of the thin film encapsulation layer TFT in the edge area EA becomes smaller, the depth of the dummy pattern DM becomes larger, so that the reflectance deviation according to the thickness of the organic layer can be compensated.

In embodiment, the size and/or depth of the dummy pattern may gradually increase toward the peripheral area. In embodiment, the size and/or depth of the via hole VIA may gradually increase toward the peripheral area.

According to embodiments, a display apparatus includes a display area (in which an image is displayed) and a peripheral area. The display area includes an edge area and a middle area. In the middle area, an organic layer of a thin-film encapsulation layer has a first height on the via hole. The organic layer in the edge area has a second height smaller than the first height on the via hole. A dummy pattern may be formed in the edge area or a size (width) and a depth (height) of the via hole in the edge area may be different from that in the middle area to compensate for a reflectance deviation. Advantageously, substantial uniform reflectance may be attained without additional processes.

Figure 11:
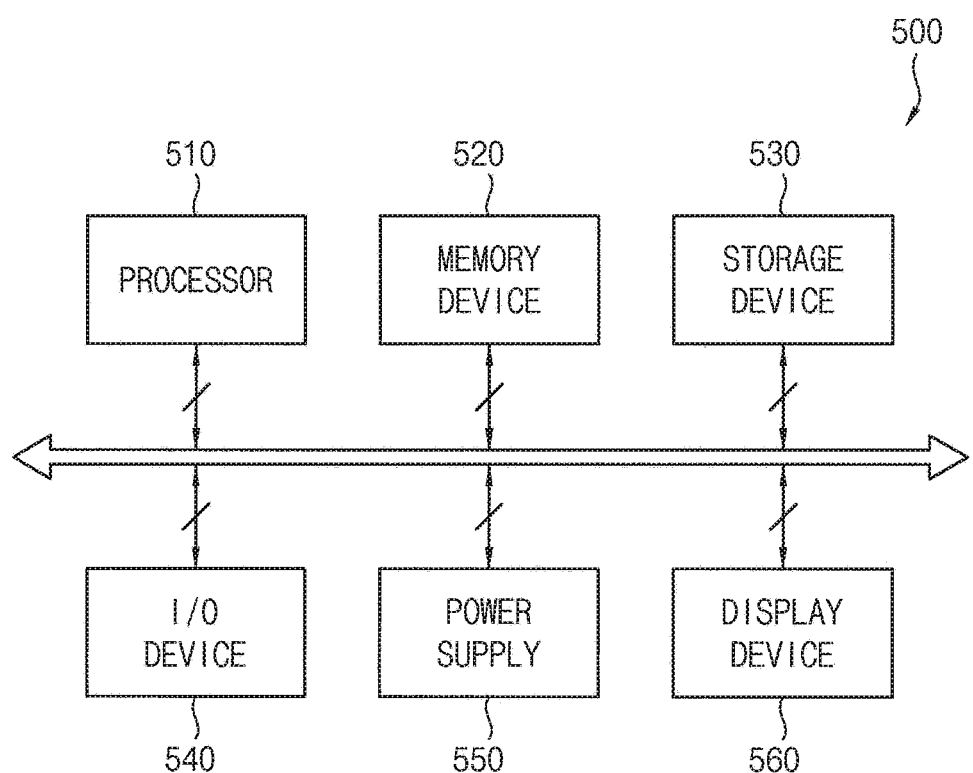
FIG. 11 is a block diagram illustrating an electronic device according to example embodiments.
Figure 12A:
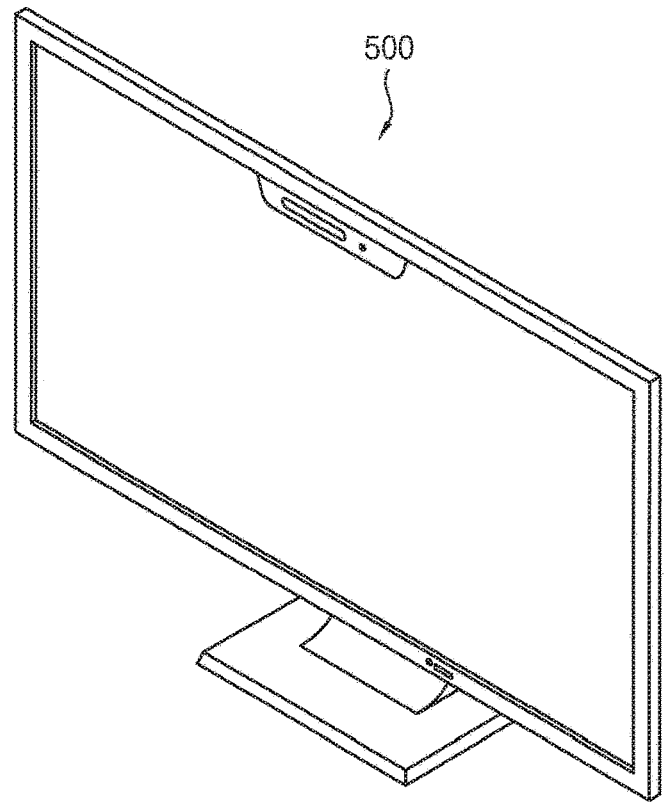
FIG. 12A is a diagram illustrating an example in which the electronic device of FIG. 11 is a television.
Figure 12B:
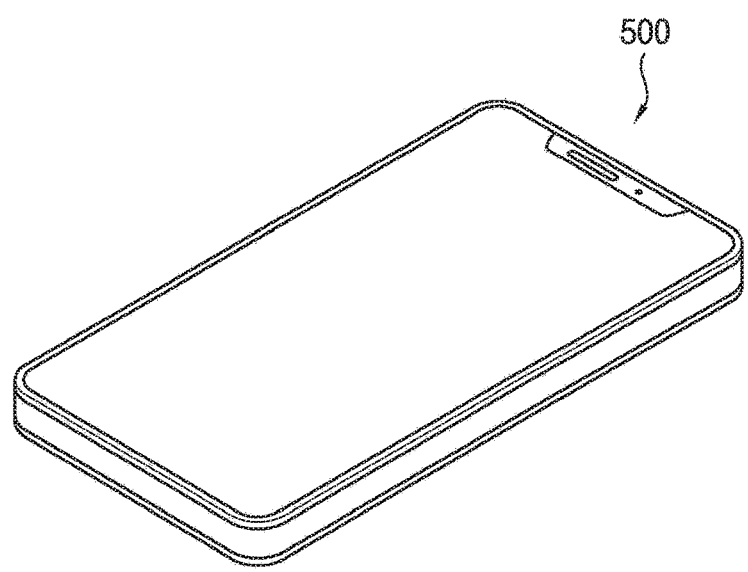
FIG. 12B is a diagram illustrating an example in which the electronic device of FIG. 11 is a smart phone.

FIG. 11 is a block diagram illustrating an electronic device according to example embodiments. FIG. 12A is a diagram illustrating an example in which the electronic device of FIG. 11 is a television. FIG. 12B is a diagram illustrating an example in which the electronic device of FIG. 11 is a smart phone.

Referring to FIGS. 11 through 12B, the electronic device 500 may include a processor 510, a memory device 520, a storage device 530, an input/output (I/O) device 540, a power supply 550, and a display device 560. The display device 560 may correspond to the display apparatus of FIG. 1. The electronic device 500 may further include a plurality of ports for communicating with one or more of a video card, a sound card, a memory card, a universal serial bus (USB) device, other electronic devices, etc. In an example embodiment, as illustrated in FIG. 12A, the electronic device 500 may be a television. In another example embodiment, as illustrated in FIG. 12B, the electronic device 500 may be a smart phone. The electronic device 500 may be one of a cellular phone, a video phone, a smart pad, a smart watch, a tablet PC, a car navigation system, a computer monitor, a laptop, a head mounted display (HMD), etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc. and an output device such as a printer, a speaker, etc. The power supply 550 may provide power for operations of the electronic device 500.

The display device 560 may be coupled to other components via the buses or other communication links. The display device 560 may be included in the I/O device 540. As described above, the dummy pattern may be formed in the edge area or the size (width) and depth (height) of the via hole may be adjusted to compensate for the reflectance difference over the entire display area.

Embodiments can be applied to organic light emitting display devices and various electronic devices. For example, embodiments can be applied to a mobile phone, a smart phone, a video phone, a smart pad, a smart watch, a tablet PC, a car navigation system, a television, a computer monitor, a notebook, and the like.

The foregoing is illustrative and is not to be construed as limiting. Although a few example embodiments have been described, many modifications are possible. All such modifications are intended to be included within the scope defined in the claims.

What is claimed is:

1. A display apparatus, comprising:
   a first transistor structure comprising a first drain electrode;
   a first pixel electrode positioned between an edge of the display apparatus and a center of the display apparatus and comprising a first recessed structure, wherein the first recessed structure directly contacts the first drain electrode;
   a second transistor structure comprising a second drain electrode: and
   a second pixel electrode positioned between the edge of the display apparatus and the first pixel electrode and comprising at least one recessed structure, wherein the at least one recessed structure comprises a second recessed structure, wherein the second recessed structure directly contacts a face of the second drain electrode, wherein a first direction is parallel to the face of the second drain electrode, and wherein a total maximum width of the at least one recessed structure in the first direction is greater than a maximum width of the first recessed structure in the first direction.

2. The display apparatus of claim 1, further comprising an organic layer, wherein a first section of the organic layer overlaps the first pixel electrode, wherein a second section of the organic layer overlaps the second pixel electrode and is thinner than the first section of the organic layer in a second direction, and wherein the second direction is perpendicular to the first direction.

3. The display apparatus of claim 2, wherein the organic layer is formed by polymerization of a monomer.

4. The display apparatus of claim 1, wherein the at least one recessed structure further comprises a third recessed structure, wherein the second recessed structure is deeper than the third recessed structure in a second direction, and wherein the second direction is perpendicular to the first direction.

5. The display apparatus of claim 1, further comprising:
   a third transistor structure comprising a third drain electrode; and
   a third pixel electrode positioned between the edge of the display apparatus and the second pixel electrode, comprising a third-pixel-electrode recessed structure, and comprising one or more additional recessed structures, wherein the third-pixel-electrode recessed structure directly contacts the third drain electrode, and wherein a total number of recessed structures of the third pixel electrode is greater than a total number of recessed structures of the second pixel electrode.

\* \* \* \* \*